(12) United States Patent
Ernst et al.

(10) Patent No.: US 6,744,272 B2
(45) Date of Patent: Jun. 1, 2004

(54) TEST CIRCUIT

(76) Inventors: Wolfgang Ernst, Tegernseer Landstrasse 28, Munich (DE), 81541; Gunnar Krause, Schlierseestrasse 8, Munich (DE), 81541; Justus Kuhn, Lipowskystrasse 4, Munich (DE), 81373; Jens Luepke, Heltauerstrasse 112, Munich (DE), 81829; Jochen Mueller, Hansjakobstrasse 105, Munich (DE), 81825; Peter Poechmueller, 59 Ford La., Colchester, VT (US) 05446; Michael Schittenhelm, Goldnesselweg 67, Poing (DE), 85586

( * ) Notice: Subject to any disclaimer, the term of this patent is extended or adjusted under 35 U.S.C. 154(b) by 6 days.

(21) Appl. No.: 10/100,504

(22) Filed: Mar. 18, 2002

(65) Prior Publication Data

US 2002/0171447 A1 Nov. 21, 2002

(30) Foreign Application Priority Data

Mar. 19, 2001 (DE) .......................... 101 13 458

(51) Int. Cl.[7] .......................... G01R 31/28; G11C 7/00; G11C 29/00
(52) U.S. Cl. .......................... 324/765; 365/201; 714/744
(58) Field of Search .......................... 324/765; 714/25, 714/724, 738, 742, 744, 748, 718, 719; 341/101; 365/201

(56) References Cited

U.S. PATENT DOCUMENTS

| | | | | |
|---|---|---|---|---|
| 5,570,381 A | * | 10/1996 | Schofield | 365/201 |
| 5,757,705 A | * | 5/1998 | Manning | 365/201 |
| 5,805,611 A | * | 9/1998 | McClure | 714/744 |
| 5,933,379 A | * | 8/1999 | Park et al. | 365/201 |
| 5,970,073 A | * | 10/1999 | Masuda et al. | 714/738 |
| 6,400,625 B2 | * | 6/2002 | Arimoto et al. | 365/201 |
| 6,489,819 B1 | * | 12/2002 | Kono et al. | 365/201 |
| 6,556,492 B2 | * | 4/2003 | Ernst et al. | 365/201 |

FOREIGN PATENT DOCUMENTS

DE    19823931 A1    5/1998   ....... G01R/31/3193

* cited by examiner

Primary Examiner—Ernest Karlsen
(74) Attorney, Agent, or Firm—Withrow & Terranova, PLLC

(57) ABSTRACT

A test circuit is adapted to test circuits having a high-frequency clock signal. The test circuit is positioned between a conventional tester and the circuit to be tested. The test circuit includes a frequency multiplication circuit which multiplies the clock signal of the conventional tester to produce a high-frequency clock signal. The test circuit also receives control signals from the conventional tester. The control signals are output to the circuit to be tested via a bus.

11 Claims, 4 Drawing Sheets

TEST CIRCUIT

This application claims the benefit of German patent application DE10113458.4, currently pending, which is incorporated herein by reference in its entirety.

FIELD OF THE INVENTION

The invention relates to a test circuit for testing a circuit clocked with a high-frequency clock signal, in particular a high-frequency DRAM memory.

BACKGROUND OF THE INVENTION

DE 198 23 931 A1 discloses a test pattern generator circuit for an IC tester. In the test pattern generator circuit, pattern data from a pattern memory are applied in parallel form to a parallel/serial converter. The parallel/serial converter can be changed over, on the basis of a mode control signal, between a serial output mode, in which the data for a data word are provided in serial form for each test cycle, and a parallel/serial output mode, in which parallel data are provided in serial form during each test cycle.

FIG. 1 shows a test arrangement based on the prior art. In this case, a circuit to be tested (DUT: Device Under Test) is tested by a tester when the manufacturing process is complete. The circuit to be tested is a synchronous semiconductor circuit clocked with a clock signal, for example a DRAM memory. The circuit to be tested is connected to the tester via a control signal bus, a data bus and an address bus. The tester uses the control signal bus to apply various control signals to the circuit to be tested. If the circuit to be tested is a DRAM memory, control lines are used to apply, inter alia, the control signals CAS (CAS: Column Address Strobe), RAS (RAS: Row Address Strobe), WE (WE: Write Enable) and CS (CS: Chip Select). The CAS signal indicates to the memory to be tested that the address which is on the address bus is a column address, while the RAS control signal indicates to the memory that the address which is on the address bus is a row address. Using the CAS control signal and the RAS control signal allows an address bus with a relatively narrow address bus width to be used. The CS control signal selects the memory which is to be tested from a multiplicity of available memories.

The clock frequencies at which modern memories are operated are becoming higher and higher, and already DRAM memories are being manufactured which operate at a clock frequency of several hundred megahertz. The drawback of the test arrangement shown in FIG. 1 is that conventional testers are not designed for such high clock frequencies. Testers suitable for testing memory chips which are clocked at a very high clock frequency of several hundred megahertz are complex in terms of circuitry and are accordingly costly.

It is therefore the object of the present invention to provide a test circuit which makes it possible to test a circuit clocked with a high-frequency clock signal using a conventional tester which outputs control signals at a comparatively low clock frequency.

The invention achieves this object by means of a test circuit having the features specified in patent claim 1.

SUMMARY OF THE INVENTION

The invention provides a test circuit for testing a circuit clocked with a high-frequency clock signal, where the test circuit has:

(a) a frequency multiplication circuit which multiplies the clock frequency of a clock signal, output by the tester, for producing the high-frequency clock signal by a frequency multiplication factor;

(b) a control signal input bus for receiving various external control signals for the circuit which is to be tested from the tester, where each control signal is received in parallel via a plurality of control lines whose number is respectively equal to the frequency multiplication factor;

(c) a parallel/serial converter which is clocked with the high-frequency clock signal, is connected to the control signal input bus and outputs each control signal to the circuit to be tested via a control line of a control signal output bus; and (d) a decoder circuit which is clocked with the high-frequency clock signal and produces internal control signals for the test circuit on the basis of the control signals which are on the control signal input bus.

The inventive test circuit has the particular advantage that the internal control signals required for the various circuit components in the test circuit are produced from the external control signals output by the tester for testing the circuit and thus do not need to be provided via additional control lines from the tester. In this way, the bus width of the control signal input bus is determined solely by the number of control signals required for the circuit which is to be tested, and is not increased by additional control signal lines for internal control signals in the test circuit. The bus width of the control signal input bus is therefore minimal.

In one preferred embodiment of the inventive test circuit, the test circuit is provided with a test data pattern generator which, on the basis of data control signals received from the tester via data control lines, applies stored test data patterns to a data comparison circuit and, via a data output driver and a data bus, to the circuit which is to be tested.

The data comparison circuit in the inventive test circuit preferably compares the output test data, received by the test circuit via the data bus and a data input driver from the circuit which is to be tested, with the test data patterns applied to the circuit to be tested.

The data input driver and the data output driver in the inventive test circuit are preferably activated by an internal read/write control signal produced by the decoder circuit.

The data comparison circuit in the inventive test circuit preferably indicates to the tester via an indicator line whether the output test data which are output by the circuit to be tested are identical to the test patterns applied to the circuit to be tested.

In this case, the data comparison circuit is preferably clocked with the high-frequency clock signal.

In one particularly preferred embodiment, the frequency multiplication factor is four.

The high-frequency clock signal preferably has a clock frequency of 400 MHz.

In one particularly preferred embodiment of the inventive test circuit, the signal delay times on the control lines of the control signal output bus are much shorter than the signal delay times on the control lines of the control signal input bus.

In one preferred embodiment, the test circuit is integrated in the circuit to be tested.

The inventive test circuit is preferably used for testing a DRAM memory.

Preferred embodiments of the inventive test circuit are described below with reference to the appended figures in order to explain features which are fundamental to the invention.

DETAILED DESCRIPTION OF THE PREFERRED EMBODIMENTS

Figure 1:
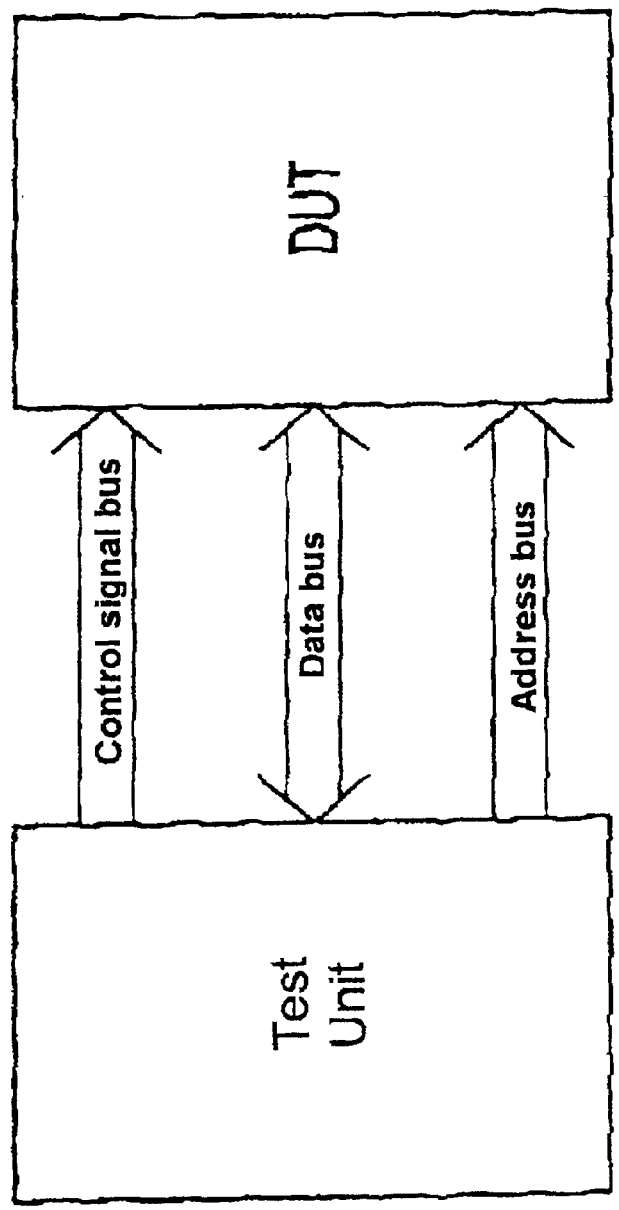
FIG. 1 shows a test arrangement based on the prior art.
Figure 2:
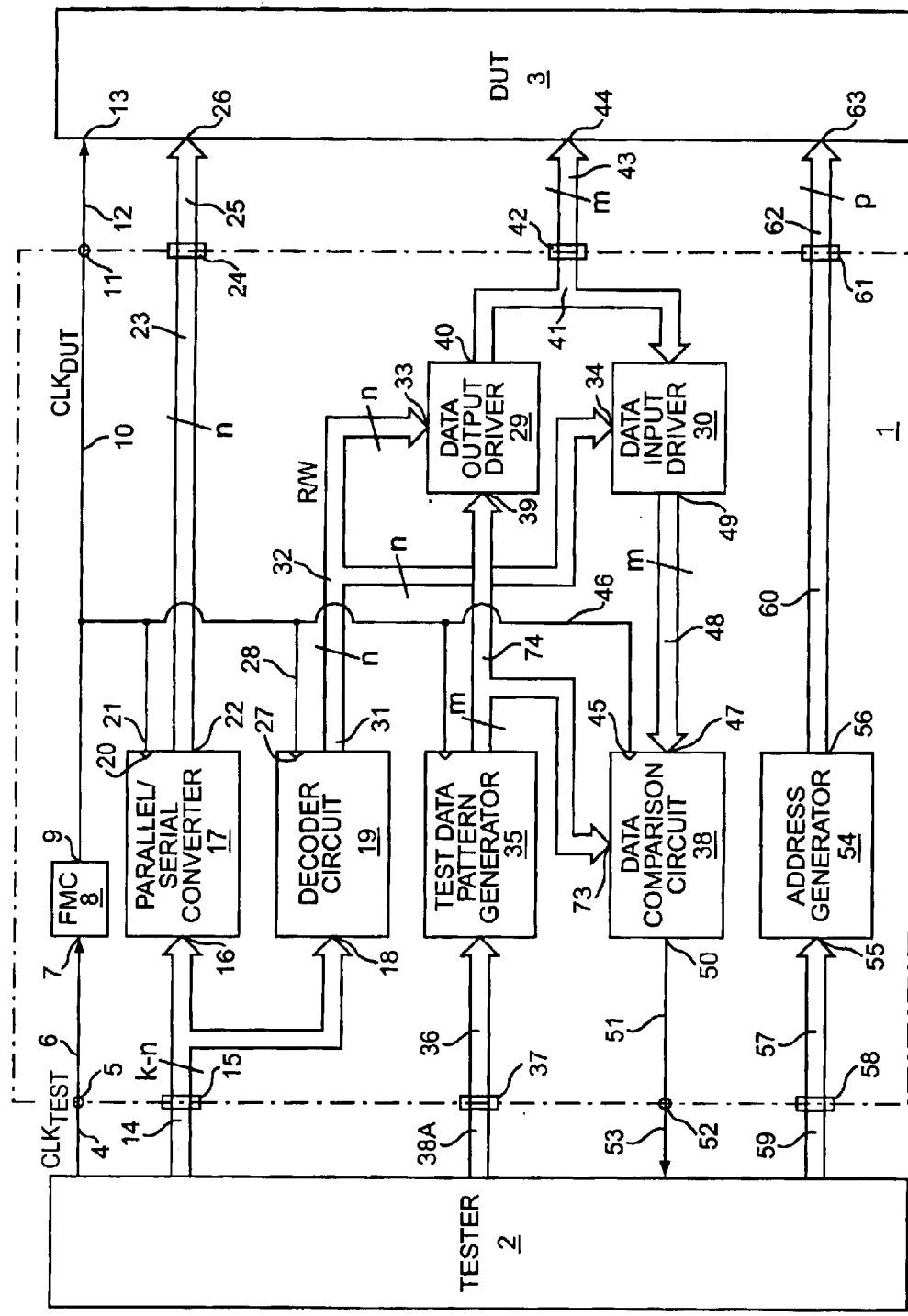
FIG. 2 shows a block diagram of a test arrangement containing the inventive test circuit.

FIG. 2 shows a test arrangement containing an inventive test circuit 1. The test circuit 1 is arranged between an external tester 2 and a circuit 3 which is to be tested. The test unit 2 is a conventional tester based on the prior art, operating at a low clock frequency. The circuit 3 to be tested is a circuit clocked with a high-frequency clock signal, for example a DRAM memory clocked at a high frequency.

The test circuit 1 receives a relatively low-frequency clock signal from the tester 2 via a clock signal input line 4. The low-frequency clock signal has a frequency of 100 MHz, for example. The low-frequency clock signal is applied to a clock signal input 5 of the test circuit 1 via the clock line 4. The clock signal input 5 passes the low-frequency clock signal received to an input 7 of a frequency multiplication circuit 8 via an internal clock signal line 6. The frequency multiplication circuit 8 increases the clock frequency by a prescribed frequency multiplication factor k in order to produce a high-frequency clock signal which is passed to a clock signal output 11 in the test circuit 1 via an output 9 and an internal clock signal line 10.

The clock signal output 11 of the test circuit 1 is connected via a clock signal line 12 to a clock input 13 of the circuit 3 to be tested.

The inventive test circuit 1 is also connected to the tester 2 via a control signal input bus 14 and receives, via control signal inputs 15, control signals which are required for testing the circuit 3. If the circuit 3 to be tested is a DRAM memory, for example, the tester 2 provides the control signals RAS, CAS, WE, CS, inter alia. In this case, each of the four control signals (n=4) is output in parallel to the test arrangement 1 via a plurality of control lines of the control signal bus 14, the number of control lines for each control signal being equal to the number of the frequency multiplication factor k. The bus width of the control signal input bus 14 is therefore identical to the product of the frequency multiplication factor k and the number n of control signals required for testing the circuit 3. If the frequency multiplication factor k is 4, for example, and if the four control signals RAS, CAS, WE, CS for testing the memory chip 3 are provided by the tester 2, the bus width of the control signal input bus 14 is sixteen.

The control signal input bus 14 is branched internally in the test circuit 1, so that the control lines of the control signal input bus 14 are connected in parallel to inputs 16 of a parallel/serial converter 17 and to inputs 18 of a decoder circuit 19. The parallel/serial converter 17 is clocked by the high-frequency clock signal via a clock input 20 and a clock line 21 and performs parallel/serial conversion on the control signals applied to the signal inputs 16. The control signals are output to a control signal output bus 23 via an output 22 and arrive at a control signal output 24 in the test circuit 1.

The control signal output 24 is connected to control inputs 26 of the circuit 3 to be tested via an external control signal output bus 25. Each of the control signals RAS, CAS, WE, CS is output by the test circuit 1 via a single control line to an associated control input 26 of the circuit 3 to be tested. The bus width of the control signal output bus 23, 25 is therefore equal to the number of control signals required for testing the circuit 3, and, in the example shown, is four.

The decoder circuit 19 likewise has a clock signal input 27 and is clocked with the high-frequency clock signal via a clock signal line 28. The decoder circuit 19 produces internal control signals for the test circuit 1 on the basis of the control signals which are on the control signal input bus 14.

In the embodiment shown in FIG. 2, the decoder circuit 19 produces an internal read/write control signal for actuating a data output driver 29 and a data input driver 30. The internal control signal produced by the decoder circuit 19 is output via a control signal output 31 in the decoder circuit 19 to a control input 33 of the data output driver circuit 29 and to a control input 34 of the data input driver circuit 30 via an internal control signal bus 32. In a first operating mode, the internal read/write control signal (R/W) activates the data output driver 29 for the purpose of writing data to the circuit 3 which is to be tested, and in a second operating mode activates the data input driver 30 for the purpose of reading data from the circuit 3 which is to be tested.

The internal control signal R/W is produced by the decoder circuit 19 on the basis of the four external control signals RAS, CAS, WE, CS. In this case, the decoder circuit 19 outputs an internal W control signal (W: Write) via the internal control signal bus 32 when the RAS control signal or row address strobe signal is at logic high, the CAS control signal or column address strobe signal is at logic low, the WE control signal or write-enable control signal is at logic low, and the CS control signal or chip-select control signal is at logic low. Conversely, the decoder circuit outputs an internal R control signal (R: Read) to the internal control signal bus 32 when the RAS control signal is at logic high, the CAS control signal is at logic low, the WE control signal is at logic high, and the CS control signal is at logic low.

The inventive test circuit 1 contains a test data pattern generator 35 which is connected to a data control input 37 of the test circuit 1 via data control lines 36. The data control input 37 of the test circuit 1 receives data control signals from the external tester 2 via external data control lines 38a. The test data pattern generator 35 contains data registers storing test data which can be written from the tester 2 to the registers via initialization lines. On the basis of the data control signals which are on the data control lines 36, the test data pattern generator 35 applies the stored test data to an input 37 of a data comparison circuit 38 and to an input 39 of the data output driver 29 via an internal data bus 36, whose data bus width m is sixteen, for example. If the data output driver 29 has been activated by means of an internal W control signal, it outputs the test data patterns produced to a data output 42 in the test circuit 1 via an output 40 and a data output bus 41. The data output 42 is connected to a data input 44 of the circuit 3 to be tested via a data bus 43 having a width of m bits.

The data comparison circuit 38 has a clock signal input 45 which is supplied with the high-frequency clock signal via a clock signal line 46. The data comparison circuit 38 compares output test data, received by the test circuit 1 at the data input 42 from a data output 44 of the circuit 3 to be tested via the data bus 43, with the test data applied to the data input 34. For this purpose, the data comparison circuit has a data input 47 which is connected to a data output 49 of the data input driver circuit 30 via an internal data bus 48. If there is a read control signal (Read) for activating the data input driver 30 on the internal control signal bus 32, the output test data output by the circuit 3 to be tested are output by the data input driver circuit 30 to the data input 47 of the data comparison circuit 38, which compares the available output test data with the expected test pattern data which are at the data input 37 and checks whether they are identical. The data comparison circuit 38 outputs, via an output 50 and a line 51, an indicator signal to an output 52 in the test circuit 1, which indicator signal indicates whether or not the test data patterns are identical to the output test data. The output 52 is connected to the tester 2 via a line 53.

The test circuit 1 also contains an address generator 54 having an input 55 and an output 56, whose input is connected to a control signal input 58 of the test circuit 1 via address control signal lines 57. The address control signal input 58 of the test circuit 1 is connected to the tester 2 via address control lines 59. On the basis of the address control signals which are on the address control lines, the address generator 54 produces addresses for memory cells which are to be tested or components of the circuit 3 which is to be tested and outputs the addresses generated in this way to an address output 61 in the test circuit 1 via an external address bus 60. The address output 61 of the test circuit 1 is connected to an address bus input 63 of the circuit 3 to be tested via an address bus 62 having the address bus width p.

The circuit 3 to be tested is preferably a memory chip, in particular a DRAM memory, which can operate at a clock frequency of 400 MHz. The frequency multiplication circuit 8 increases the clock frequency of the clock signal which is output by the tester 2, which is 100 MHz, for example, by the frequency multiplication factor of four and outputs the high-frequency clock signal to the clock signal input 13 of the circuit 3 to be tested. At the same time, the necessary control signals are applied at the high-frequency via the control signal output bus 25. This is achieved by parallel/serial conversion of the low-frequency control signals which are on the control signal input bus 14. At the same time, the decoder circuit 19 produces the necessary internal control signals of the test circuit 1 from the low-frequency control signal which is on the control signal input bus 14. The internal read/write control signal R/W (shown in FIG. 2) for actuating the data output driver 19 and the data signal input driver 30 is generated within the test circuit 1 by the decoder circuit 19, so that the read/write control signal does not need to be provided by the external tester 2 via additional control lines. Evaluating the externally provided control signals RAS, CAS, WE, CS for generating the internal control signal R/W saves additional external control signal lines in the control signal input bus 14, which means that a tester 2 with relatively low circuit complexity can be used. The test circuit 1 shown in FIG. 2 makes it possible to test a high-frequency memory operating at an operating frequency of 400 MHz, for example, using a tester 2 which provides control signals at a comparatively low clock frequency of only 100 MHz.

The signal delay times on the control lines of the control signal output bus 25 are preferably much shorter than the signal delay times on the control lines of the control signal input bus 14. This means that the control signals applied to the circuit 3 to be tested are much less sensitive to interference.

In one preferred embodiment, the inventive test circuit 1 is in the form of an independent application-specific integrated circuit (ASIC).

In an alternative embodiment, the inventive test circuit 1 is integrated in the circuit 3 to be tested. This affords the particular advantage that the line lengths of the control signal output bus 25, of the data output bus 43 and of the address bus 62 are particularly short, and hence the signals which are present become particularly insensitive to interference.

The exemplary embodiment shown in FIG. 2 shows the generation of an internal read/write control signal R/W on the basis of the external control signals. In other embodiments, further additional, necessary internal control signals in the test circuit 1 are generated by the decoder circuit 19 on the basis of the external control signals.

Figure 3:
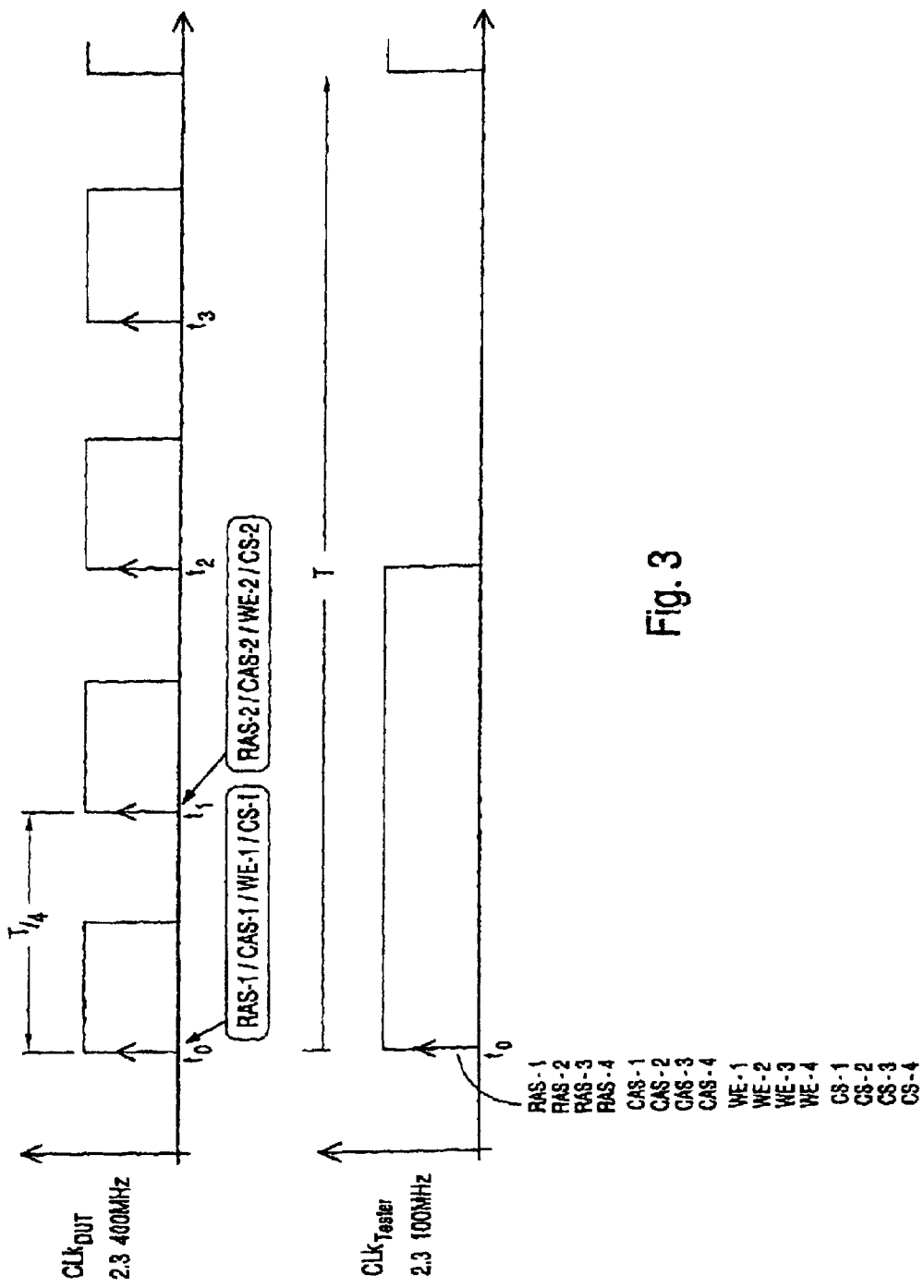
FIG. 3 shows a timing diagram to explain the way in which the inventive test circuit works.

FIG. 3 shows sequence diagrams to explain the way in which the inventive test circuit 1 works. At the time to, the test circuit 1 receives a relatively low-frequency clock signal $CLK_{Tester}$ from the tester 2 at a clock frequency of 100 MHz, for example. On the rising edge of the clock signal applied to the clock input 5, the decoding circuit 19 receives the RAS control signal via four control lines, the CAS control signal via another four control lines, the WE control signal via another four control lines and the CS control signal via another four control lines, and evaluates them. The parallel/serial converter 17 outputs a group of four control signals (CAS, RAS, WE, CS) to the circuit 3 which is to be tested, with a very short time delay with respect to the time $t_0$ of the first rising edge of the high-frequency clock signal. At the times $t_1$, $t_2$, $t_3$, the parallel/serial converter 17 applies further groups of control signals to the circuit 3 to be tested, in each case on the rising signal edge of the high-frequency clock signal.

Figure 4:
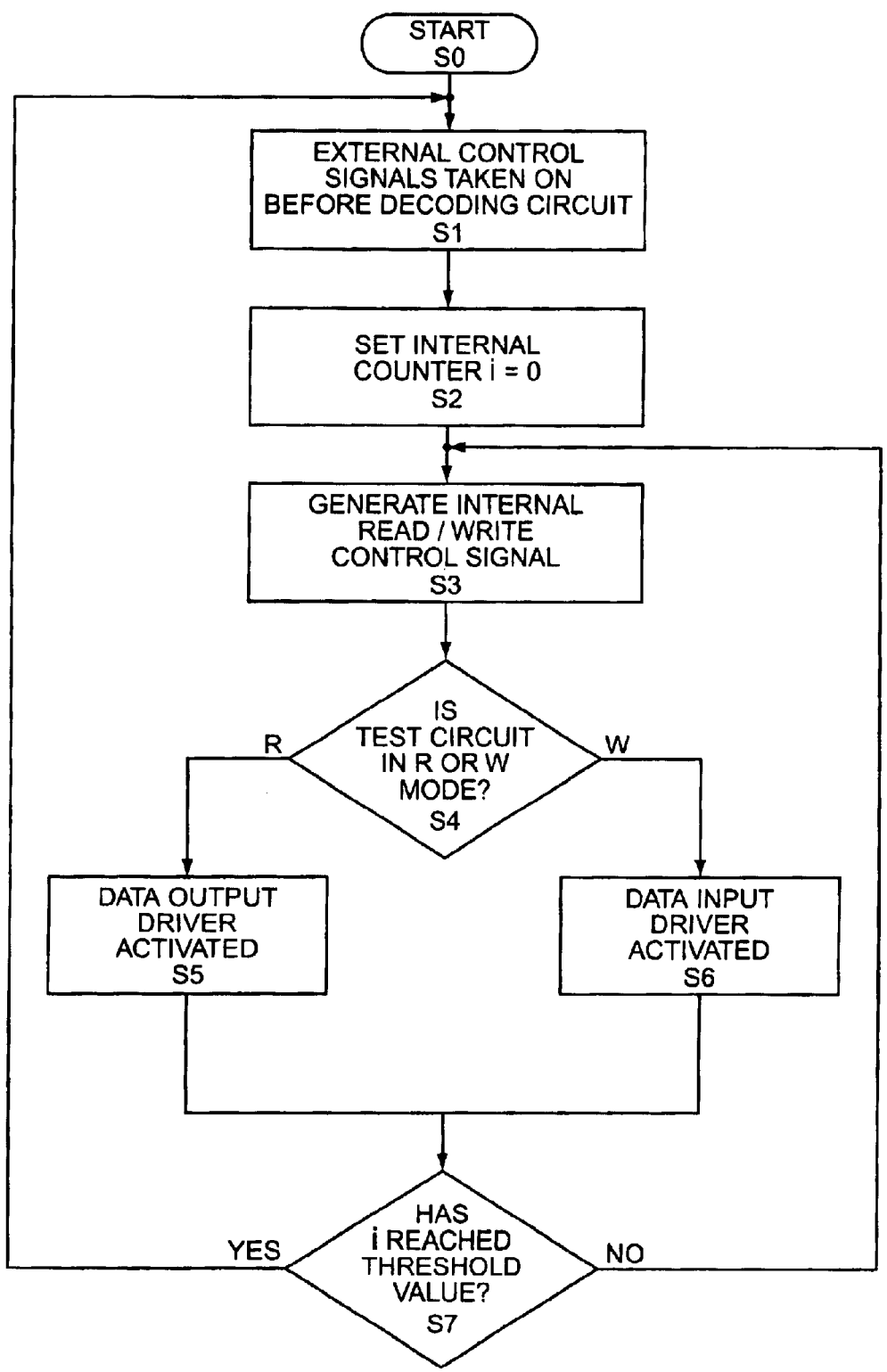
FIG. 4 shows a flowchart to explain the way in which the inventive test circuit works.

FIG. 4 shows a flowchart of the functional sequence within the inventive test circuit 1.

After a starting step $S_0$, the sixteen external control signals applied to the input 19, which are provided by the tester 2, are taken on by the decoding circuit 19 in a step $S_1$.

In a step $S_2$, an internal counter i is set to zero, and in a step $S_3$ the internal read/write control signal R/W is generated by the decoding circuit 19 on the basis of the external control signals which are present.

In a step $S_4$, the test circuit 1 checks whether a read operating mode (R) or a write operating mode (W) exists.

In a step $S_5$, in the read operating mode, the data output driver 29 is activated, or alternatively, in a write operating mode (W), the data input driver 30 is activated in a step $S_6$.

In a step $S_7$, a check is performed to determine whether the counter i has reached a threshold value SW, with n being the ratio between the clock frequency $f_{DUT}$ of the high-frequency clock signal and the clock frequency $f_{CLK}$ of the low frequency clock signal provided by the tester 2. If the counter i has reached the threshold value SW, the procedure returns to step $S_1$, and in the converse instance, the next internal control signal is generated by the decoder circuit 19 in step $S_3$.

What is claimed is:

1. A test circuit adapted to interface between a tester and a circuit to be tested, the tester outputting a clock signal at a clock frequency, said test circuit comprising:

a) a frequency multiplication circuit adapted to receive the clock signal from the tester and produce a high-frequency clock signal, said high-frequency clock signal equivalent to the clock signal multiplied by a frequency multiplication factor;

b) a control signal input bus for receiving various external control signals for the circuit to be tested from the tester, where each control signal is received in parallel from the tester via a plurality of control lines whose number is respectively equal to the frequency multiplication factor;

c) a parallel/serial converter which is clocked with the high-frequency clock signal, said parallel/serial converted connected to the control signal input bus and is adapted to output each control signal to the circuit to be tested via a control line of a control signal output bus; and d) a decoder circuit adapted to clock with the high-frequency clock signal and further adapted to produce internal control signals for the test circuit on the basis of the control signals which are on the control signal input bus.

2. The test circuit as claimed in claim 1, wherein the test circuit has a test data pattern generator which, on the basis of data control signals received from the tester via data control lines, applies stored test data patterns to a data comparison circuit and, via a data output driver and a data bus, to the circuit which is to be tested.

3. The test circuit as claimed in claim 1, wherein the data comparison circuit compares output test data, received by the test circuit via the data bus and a data input driver from the circuit which is to be tested, with the test data patterns applied to the circuit to be tested.

4. The test circuit as claimed in claim 1, wherein the data output driver and the data input driver are activated by an internal read/write control signal produced by the decoding circuit.

5. The test circuit as claimed in claim 1, wherein the data comparison circuit indicates to the tester via an indicator line whether the output test data which are output by the circuit to be tested are identical to the test data patterns applied to the circuit to be tested.

6. The test circuit as claimed in claim 1, wherein the data comparison circuit is clocked with the high-frequency clock signal.

7. The test circuit as claimed in claim 1, wherein the frequency multiplication factor is four.

8. The test circuit as claimed in claim 1, wherein the high-frequency clock signal has a clock frequency of 400 MHz.

9. The test circuit as claimed in claim 1, wherein the signal delay times on the control signal output bus are much shorter than the signal delay times on the control lines of the control signal input bus.

10. The test circuit as claimed in claim 1, wherein the test circuit is integrated in the circuit to be tested.

11. The use of the test circuit as claimed in claim 1 for testing a DRAM memory.

* * * * *